US006891756B2

(12) United States Patent
Zink et al.

(10) Patent No.: US 6,891,756 B2
(45) Date of Patent: May 10, 2005

(54) FLASH MEMORY COMPRISING AN ERASE VERIFY ALGORITHM INTEGRATED INTO A PROGRAMMING ALGORITHM

(75) Inventors: Sebastien Zink, Aix En Provence (FR); Bruno Leconte, Rousset (FR); Paola Cavaleri, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/789,449

(22) Filed: Feb. 26, 2004

(65) Prior Publication Data

US 2004/0264250 A1 Dec. 30, 2004

(30) Foreign Application Priority Data

Feb. 27, 2003 (FR) .............................. 03 02398

(51) Int. Cl.[7] .............................................. G11C 16/04
(52) U.S. Cl. .......................... 365/185.18; 365/185.09; 365/185.03
(58) Field of Search .................. 365/185.18, 185.09, 365/185.03, 185.19, 185.2, 185.22, 185.29

(56) References Cited

U.S. PATENT DOCUMENTS

| 4,460,982 | A | | 7/1984 | Gee et al. ................... 365/189 |
|---|---|---|---|---|
| 4,763,305 | A | | 8/1988 | Kuo .......................... 365/200 |
| 6,501,682 | B2 | | 12/2002 | Yoshida ................. 365/185.22 |
| 6,519,180 | B2 | * | 2/2003 | Tran et al. ............. 365/185.03 |
| 2001/0048609 | A1 | | 12/2001 | Hikida .................... 365/185.2 |
| 2003/0101390 | A1 | * | 5/2003 | Di Zenzo et al. ........... 714/716 |

FOREIGN PATENT DOCUMENTS

EP          0 782 147 A1    7/1997

* cited by examiner

Primary Examiner—Richard Elms
Assistant Examiner—Dang T Nguyen
(74) Attorney, Agent, or Firm—Lisa K. Jorgenson; Robert Iannucci; Seed IP Law Group PLLC (57) ABSTRACT

An electrically erasable and programmable memory includes memory cells and a verify-program device. The memory also includes an erase verify device arranged for supplying an erase verify signal having a determined value when a datum read in a memory cell during a first verify-program cycle has an erase logic value. Application particularly to performing a blank verify test in serial input/output Flash memories.

20 Claims, 6 Drawing Sheets

FLASH MEMORY COMPRISING AN ERASE VERIFY ALGORITHM INTEGRATED INTO A PROGRAMMING ALGORITHM

BACKGROUND OF THE INVENTION

1. Field of the Invention

The present invention relates to electrically erasable and programmable memories in integrated circuits, and more particularly the testing of these memories prior to marketing.

The present invention also relates to the implementation of a so-called "blank verify" or erase verify test, in serial input/output Flash memories.

2. Description of the Related Art

The testing of an electrically erasable and programmable memory integrated onto a micro-wafer of silicon is an essential step allowing integrated circuits having manufacturing defects to be detected.

Out of the various tests known, the erase verify test allows manufacturing defects such as short-circuits due to residual filaments of metal or polycrystalline silicon deposited unintentionally on the surface of the integrated circuits to be detected.

This test is generally applied to all the pages of a memory and comprises, for each page, the following steps:
- complete erasure of the page,
- programming the page word by word, and verifying before each word is programmed that the programming of the adjacent word has not affected the memory cells to be programmed,
- rejection of the memory if one memory cell presumed to be in the erased state contains a bit the logic value of which corresponds to the programmed state.

Figure 1A:
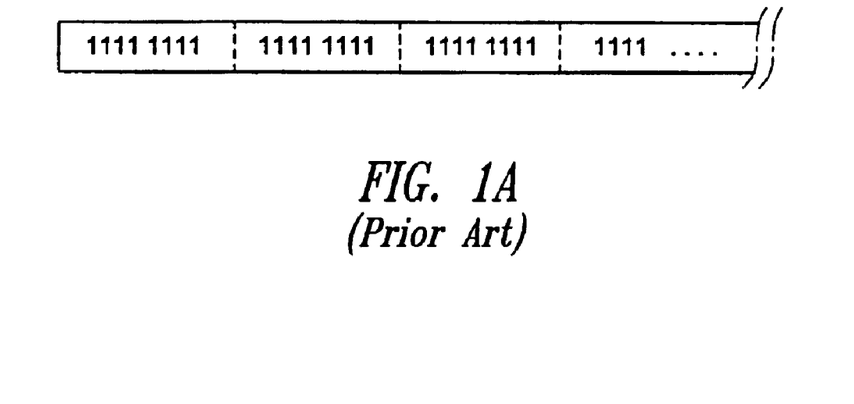
FIGS. 1A, 1B, 1C described above show an erase verify test.
Figure 1B:
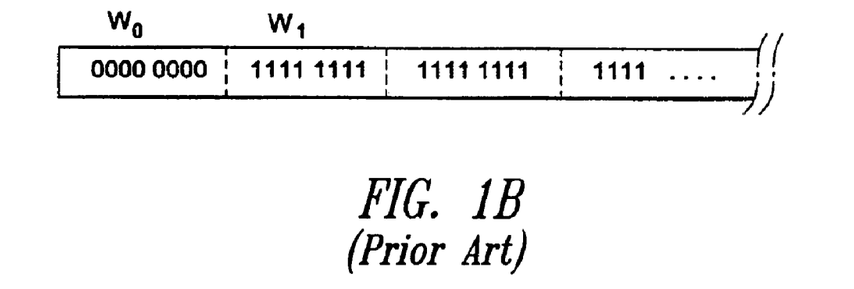
Figure 1C:
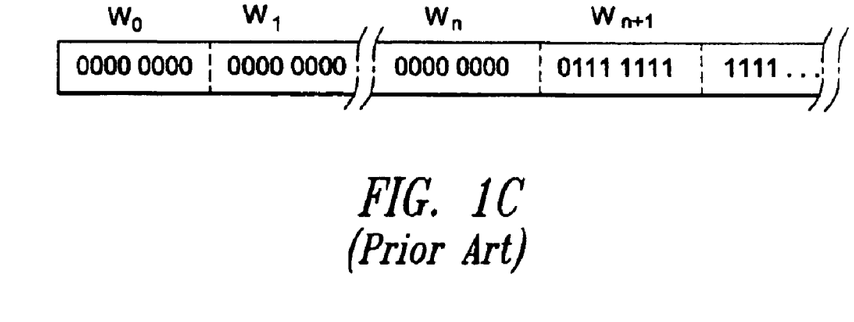

This test is illustrated on FIGS. 1A, 1B, 1C. On FIG. 1A, a page of a memory containing words of 8 bits or bytes has been entirely erased and thus only comprises words equal to 1 (the logic 1 being considered here and in the description below as the erase logic value, i.e. the logic value contained in a memory cell in the erased state). On FIG. 1B, the first word W0 of the page has been set to 0 which corresponds to an operation of programming all the memory cells containing the bits of the word W0. The adjacent word W1 or second byte of the page only comprises 1s, as well as the following bytes of the page, such that no defect is noticed. FIG. 1C represents a case of failure of the erase verify test. After programming the nth word Wn of the page, the following word Wn+1 is read and comprises the byte "01111111" instead of the byte "11111111". That means that a short-circuit has led to the unintentional programming of the first memory cell of the word Wn+1 during the programming of the word Wn (or of another word, although the short-circuits generally occur between adjacent memory cells). A memory having this type of malfunction is thus rejected.

Figure 2A:
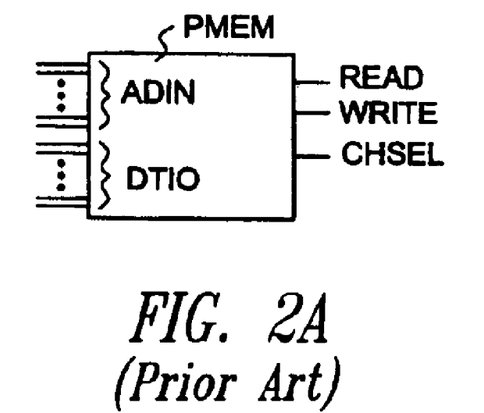
FIGS. 2A, 2B described above schematically represent a parallel input/output memory and a serial input/output memory.

On a parallel input/output Flash memory PMEM, of the type represented in FIG. 2A, the implementation of this test does not present any particular difficulty. The memory PMEM comprises a parallel address input ADIN, parallel data inputs/outputs DTIO, an input for receiving a write command WRITE, an input for receiving a read command READ, and a select input CHSEL. After erasing a page, the erase verify test sequence is done word by word and comprises the addressing of the target word, the reading of the target word to check that this word only comprises 1s, then the setting to 0 of the word (programming all the corresponding memory cells).

Figure 2B:
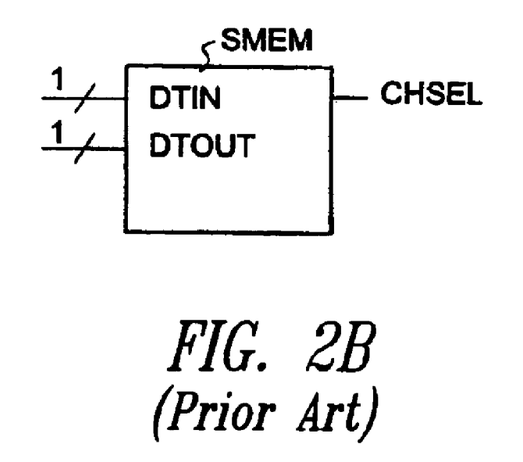

On the other hand, on a serial input/output Flash memory SMEM, of the type represented in FIG. 2B, the implementation of this test has the disadvantage of requiring a quite considerable amount of time. This memory only comprises one serial input for receiving data DTIN, one serial output for sending data DTOUT, and one select input CHSEL. The application of a read command requires the application bit by bit to the serial input of a code of the operation to be performed, of the address of the word to be read, i.e. in general at least 4 bytes (1 command byte and 3 address bytes), then the reading bit by bit of the word at the output DTOUT. The same applies to the writing of a word, which requires the application bit by bit of the value of the word to be written.

Thus, an erase verify test takes a long time to implement on a serial Flash memory and increases the cost prices of the serial memories by slowing down production rates, the test steps being part of the manufacturing process.

BRIEF SUMMARY OF THE INVENTION

One embodiment of the present invention overcomes this disadvantage.

One embodiment of the present invention is based on the fact that a Flash memory of the above-mentioned type generally comprises a program device arranged for saving a datum in a memory cell by executing a verify-program cycle comprising the following steps:

a) reading the memory cell that must receive the datum, b) comparing the datum read in the memory cell and the datum to be saved, c) applying to the memory cell a pulse of a programming voltage, if the datum to be saved has a logic value corresponding to a programmed memory cell and if the datum read in the memory cell has a logic value corresponding to an erased memory cell.

This verify-program cycle is repeated until the datum read is equal to the datum to be saved, without exceeding N cycles.

In this memory, the programming operation therefore comprises a prior read of the memory cell, then the application of a pulse of programming voltage, then another read of the memory cell followed by the application of another pulse of programming voltage, and so on and so forth until the memory cell is programmed.

One embodiment of the present invention is based on the fact that the first read of the memory cell is done before applying the first pulse of programming voltage, and therefore reflects the programmed or erased state of the memory cell. The idea of one embodiment of the present invention is therefore to integrate an erase verify step into a programming operation by checking that the value of the datum read before the application of the first pulse of programming voltage, does correspond to an erased memory cell. Therefore, if the datum read is equal to 1, then the datum is valid within the meaning of the erase verify test.

More particularly, one embodiment of the present invention provides an electrically erasable and programmable memory, comprising memory cells and a verify-program device arranged for saving a datum in a memory cell by repeating a verify-program cycle until the datum is saved in the memory cell, without exceeding N cycles, a verify-program cycle comprising a step of reading the memory cell then applying a pulse of a programming voltage to the memory cell if the datum to be saved has a program logic value and if the datum read in the memory cell has an erase logic value, the memory comprising an erase verify device arranged for: supplying an erase verify signal having a determined value when the datum read in a memory cell during the first verify-program cycle of an operation of programming the memory cell, has an erase logic value, and latching the erase verify signal before applying the first pulse of programming voltage to the memory cell.

According to one embodiment, the erase verify device is arranged for supplying an erase verify signal having the determined value when a datum to be saved itself has an erase logic value.

According to one embodiment, the memory comprises a determined number of sense amplifiers for simultaneously reading a corresponding number of selected memory cells during an operation of saving data in the selected memory cells, and wherein the erase verify device comprises a corresponding number of erase verify circuits, each erase verify circuit being linked to a sense amplifier and supplying an individual signal for erase verifying a memory cell having the determined value when the datum read in the memory cell during the first verify-program cycle of the memory cell has the erase logic value.

According to one embodiment, an erase verify circuit comprises a logic gate receiving at one input the datum read during the first verify-program cycle of the memory cell, and supplying the individual erase verify signal.

According to one embodiment, the logic gate is arranged for combining the datum read in the memory cell during the first verify-program cycle of the memory cell and the datum to be saved in the memory cell, the individual erase verify signal varying according to the result of the combination.

According to one embodiment, the logic gate is of OR or NOR type.

According to one embodiment, the erase verify device comprises a logic circuit for collecting all the individual erase verify signals supplied by the erase verify circuits, and for supplying a collective signal for erase verifying a plurality of memory cells.

According to one embodiment, the memory comprises means for latching the value of the collective verify signal before applying the first pulse of programming voltage.

According to one embodiment, the memory comprises means for supplying a series of pulses of verify signals applied to the verify-program device, and for supplying an erase verify latching signal after sending the first pulse of the verify signal.

One embodiment of the present invention also relates to a method for testing an electrically erasable and programmable memory, comprising memory cells and a verify-program device arranged for performing an operation of saving a datum in a memory cell by repeating a verify-program cycle until the datum is saved, without exceeding N cycles, a verify-program cycle comprising a step of reading the memory cell that must receive the datum then applying a pulse of a programming voltage to the memory cell if the datum to be saved in the memory cell has a program logic value and if the data read in the memory cell has an erase logic value, a method comprising the following steps: supplying an erase verify signal having a determined value when the datum read in a memory cell during the first verify-program cycle of an operation of programming the memory cell, has an erase logic value, and latching the erase verify signal before applying the first pulse of programming voltage to the memory cell.

According to one embodiment, the method comprises the production of an erase verify signal having the determined value when a datum to be saved itself has the erase logic value.

According to one embodiment, the method is applied to a memory comprising a determined number of sense amplifiers allowing a corresponding number of selected memory cells to be simultaneously read during an operation of saving data in these memory cells, and comprising the production of a corresponding number of individual erase verify signals during the saving of data in a corresponding number of memory cells.

According to one embodiment, the method comprises the combination of the individual erase verify signals to supply a collective signal for erase verifying a plurality of memory cells.

According to one embodiment, the method comprises latching the collective erase verify signal before applying the first pulse of programming voltage.

BRIEF DESCRIPTION OF THE DRAWINGS

These features and advantages of the present invention will be explained in greater detail in the following description of the method of some embodiments of the present invention and of an electrically erasable and programmable memory implementing this method, given in relation with, but not limited to the following figures.

DETAILED DESCRIPTION OF THE INVENTION

Example of a Classical Memory Comprising a Verify-Program Device

Figure 3:
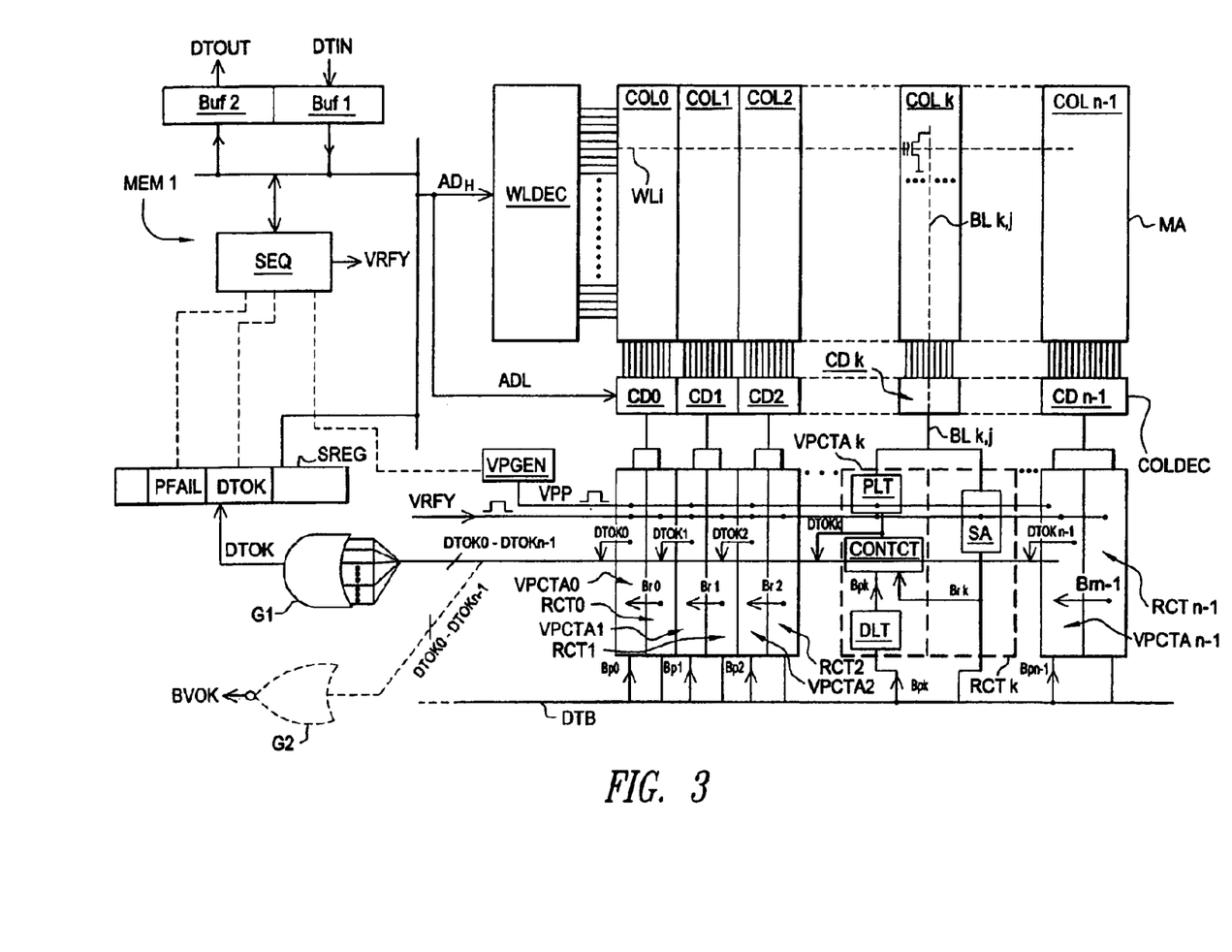
FIG. 3 represents an electrically erasable and programmable serial memory comprising a classical verify-program device.

FIG. 3 represents a serial Flash memory MEM1 of classical type, comprising a memory cell verify-program device.

The memory comprises a memory array MA driven by a word line decoder WLDEC and a column decoder COLDEC. The memory is here of serial type and comprises an input buffer BUF1 with serial input and parallel output and an output buffer BUF2 with parallel input and serial output. The serial input of the buffer BUF1 is linked to a data input DTIN of the memory and the parallel output of the buffer BUF1 is linked to a data bus DTB of the memory. The parallel input of the buffer BUF2 is linked to the data bus DTB and the serial output of the buffer BUF2 is linked to a data output DTOUT of the memory. The data bus DTB is linked to a sequencer SEQ, to the word line decoder WLDEC and to the column decoder COLDEC. The hardwired logic or microprocessor sequencer executes instructions for writing or reading data received in the form of instruction codes via the serial input DTIN.

The memory array MA is here of Flash type and comprises memory cells formed by floating-gate transistors FGT. The memory array MA comprises word lines WLi and bit lines BLk,j. The bit lines are grouped together into n electric columns COLk (COL0, COL1, COL2, . . . COLn−1) k being a column index ranging from 0 to n−1. Each electric column of rank k comprises J bit lines BLk,j, j being an index ranging from 0 to J−1. The bit lines BLk,j are linked to the drains of floating-gate transistors FGT, while the word lines WLi are linked to the control gates of the transistors FGT. The memory cells linked to the bit lines BLk,j of a column COLk contain bits of the same significance. Therefore, a binary word of n bits is saved in n cells each located in a determined electric column, in accordance with a classical method of interleaving binary words in Flash memories. Furthermore, one page of the memory is formed by all the memory cells linked to the same word line WLi and comprises J binary words of n bits each, each bit of a word being saved in an electric column.

The decoder COLDEC comprises n decode blocks CDk (CD0, CD1, . . . CDn−1). Each decode block CDk is associated with an electric column COLk, and comprises an output and n inputs linked to the bit lines of the column. Each decode block CDk selects at its output a bit line BLk,j of the column COLk, according to a logic column address ADL applied to the decoder (a logic column address being the address of a word of n bits in a page of the memory array). The output of each decode block CDk is linked on the one hand to a read circuit RCTk (RCT0, RCT1, . . . RCTn−1) and on the other hand to a verify-program circuit VPCTAk (VPCTA0, VPCTA1, . . . VPCTAn−1).

Each read circuit RCTk comprises a sense amplifier SA having a read input linked to an output of the corresponding decode block, and an output linked on the one hand to the data bus DTB and on the other hand to the verify-program circuit VPCTAk of corresponding rank.

The structure of a verify-program circuit VPCTAk of rank k is schematically represented in FIG. 3. The circuit VPCTAk comprises a data latch DLT, a logic control circuit CONTCT and a programming latch PLT. The input of the latch DLT is linked to the data bus DTB and receives a bit Bpk to be saved in a memory cell of the corresponding column. The control circuit CONTCT is linked to the output of the latch DLT, for receiving the bit Bpk, and to the output of the sense amplifier SA of the circuit RCTk, for receiving a bit Brk read by the sense amplifier during a verify-program cycle described below. The control circuit CONTCT supplies a signal DTOKk to the programming latch PLT. The programming latch PLT has an output linked to the output of the decode block CDk, a control input receiving the signal DTOKk, a trigger input receiving a verify signal VRFY common to all the programming latches of the other verify-program circuits, and an input receiving pulses of a programming voltage VPP supplied by a generator VPGEN driven by the sequencer SEQ.

The saving of a binary word comprising bits Bp0, Bp1, Bp2, . . . Bpk . . . Bpn−1 classically comprises the following steps:

application of a word line address ADH to the decoder WLDEC (most significant address bits), erasure of the page selected by the decoder WLDEC (all the bits are set to 1), application to the decoder COLDEC of a logic column address ADL (least significant address bits) corresponding to the rank of the binary word in the selected page, loading of the bits Bp0, Bp1, Bp2, . . . Bpk, Bpn−1 into the latches DLT of the verify-program circuits VPCTAk, with one bit per latch, application to the memory cells of verify-program cycles, until all the memory cells to be programmed are programmed.

A verify-program cycle comprises the application of a pulse VRFY and of a pulse VPP. On the rising edge of the pulse VRFY, each sense amplifier reads a bit Brk in the selected memory cell. On each falling edge of the pulse VRFY, the programming latch PLT becomes transparent if the signal DTOKk is on 0 or goes off if the signal DTOKk is on 1. If the latch is transparent, it sends the pulse of programming voltage VPP to the bit line when this pulse is sent.

The control circuit CONTCT of each verify-program circuit VPCTAk executes for example the following logic function:

$$DTOKk = Bpk + /Bpk * /Brk$$

"+" being the OR function and "*" the AND function.

In other terms, the signal DTOK goes to 1 in the following cases:

if the bit to be saved Bpk is equal to 1, which means that there is no programming to be performed on the memory cell, and if the bit to be saved Bpk is equal to 0 and the bit read Brk is equal to 0, which means that it is no longer necessary to apply pulses of programming voltage to the memory cell as the latter is already programmed.

In order to control the programming operation in its entirety, the signals DTOKk (DTOK0 to DTOKn−1) are collected by an AND type logic gate G1, the output of which delivers a collective signal DTOK that only goes to 1 when all the individual signals DTOKk are on 1. The signal DTOK is loaded as a flag into a state register SREG of the memory, and is refreshed upon each verify-program cycle. The sequencer SEQ stops sending the pulses of programming voltage VPP (stop of the generator VPGEN) when the collective signal DTOK goes to 1. The sequencer also stops sending the pulses of programming voltage VPP when the signal DTOK does not go to 1 after applying N pulses of programming voltage. That means that at least one memory cell is defective and cannot be programmed. A flag PFAIL (Program Fail) is then set to 1 in the register SREG, to indicate a programming error to the user.

Description of the Erase Verify Method According to One Embodiment of the Present Invention As indicated above, the implementation of the erase verify test is long and tedious in a serial memory like the one that has just been described, since the write and read instructions are applied to the memory bit by bit, in the form of serial data comprising the instruction code of the operation to be performed and the address of the word to be programmed or to be read. One embodiment of the present invention is based on the premise according to which, during the programming operation that has just been described, the memory cells in which data must be saved are read before receiving the first pulse of programming voltage (reading on the first rising edge of the signal VRFY). This embodiment uses the read information supplied by each sense amplifier during the first verify-program cycle, to produce an individual erase verify signal, and collecting all the individual erase signals to form a collective erase verify signal. In other terms, this embodiment integrates an erase verify algorithm into the classical verify-programming algorithm.

For a better understanding, it will be assumed that a page of the memory array, after being erased, is programmed word by word by setting all the binary words to 0. The following programming sequence is then executed, assuming here that the words are bytes (n=8):

(i) 1111111111111111111111111111111111111 . . .
(ii) 00000000111111111111111111111111111 . . .
(iii) 0000000000000000111111111111111111 . . .
(iv) 000000000000000000000000111111111111 . . .

In (i) the page is erased. In (ii) the first word (word underlined) is set to 0, in (iii) the second word is set to 0, in (iv) the third word is set to 0, etc. Each reset of a word corresponds to programming all the memory cells of the word, in accordance with the erase verify test. So that the erase verify test is complete, it is necessary to check that each word, before being set to 0, only comprises bits on 1. This makes it possible to check that an erased memory cell has not been accidentally programmed during the programming of adjacent memory cells.

In the programming sequence described above, the first verify-program cycle occurring in each operation of programming a word (words underlined), comprises reading the memory cells before applying the first pulse of programming voltage. Therefore, all the verify signals DTOKk sent by the control circuits CONTCT must ordinarily be on 0 before applying the first pulse of programming voltage, if the data read are effectively on 1 and if all the data to be saved are equal to 0. The observation of the signals DTOKk upon the first verify pulse preceding the first pulse of programming voltage can thus make it possible to find out whether the cells are indeed in the erased state.

Thus, as shown in FIG. 3 in dotted lines, the method can be implemented in a simple manner by taking off the verify signals DTOKk sent by each verify-program circuit and by applying them to a second logic gate G2, such as a NOR type gate for example, the output of which delivers a collective signal BVOK (Blank verify OK). The signal BVOK must be latched at the end of the first reading of the first verify-program cycle, since it changes value when a memory cell switches to the programmed state. If the signal BVOK is on 1 at the end of the first reading of the first verify-program cycle, that means that all the individual signals BVOKk are on 0, and consequently that the memory cells are all in the erased state, the result of the erase verify test being, in this case, positive.

A preferred embodiment of the method according to the present invention will be described below, in which individual verify signals BVOKk are produced by comparing the datum read during the first verify-program cycle and the datum to be saved, so as to offer more extensive test possibilities than those offered by a simple observation of the signals DTOKk.

Figure 4:
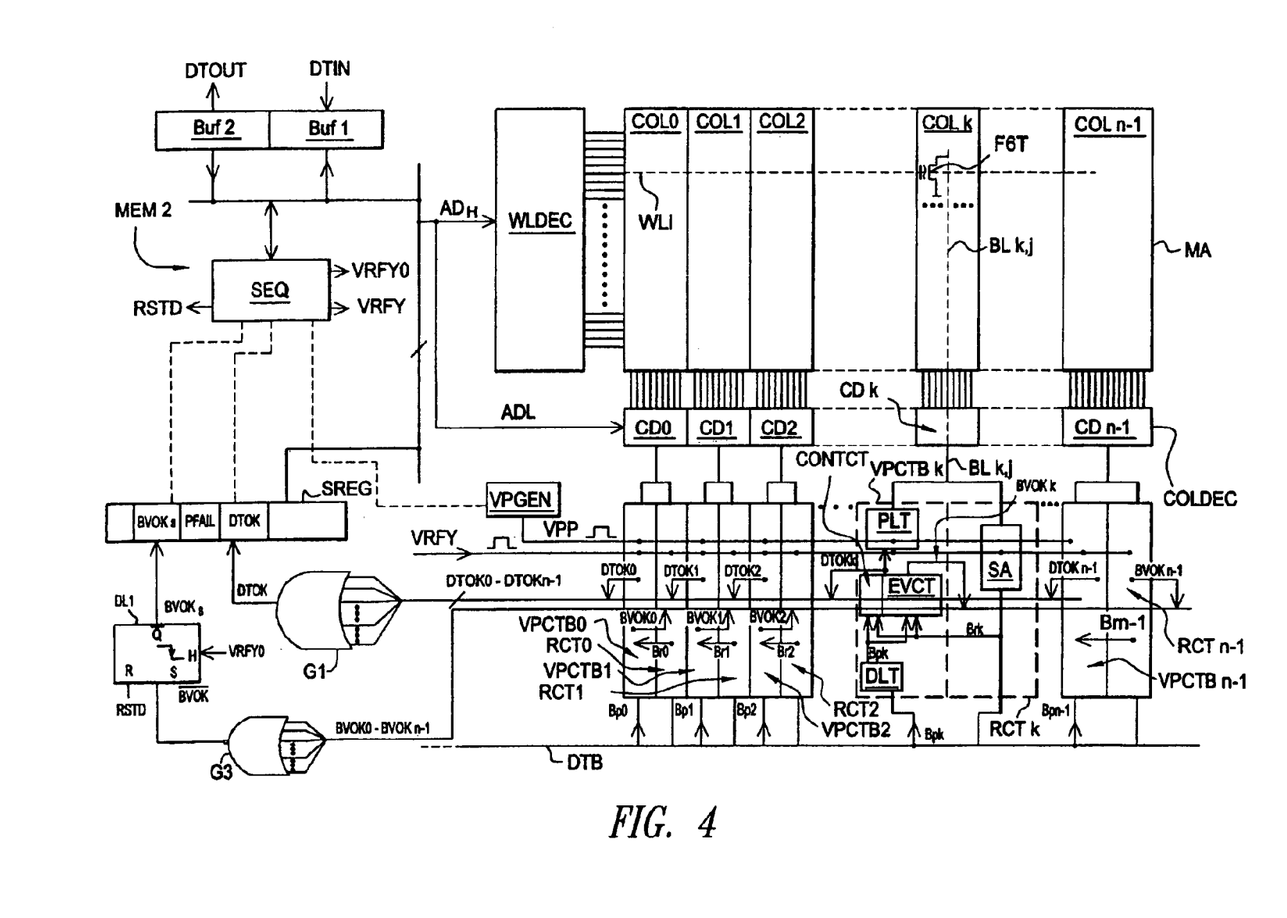
FIG. 4 represents an electrically erasable and programmable serial memory comprising a classical verify-program device and an erase verify device according to one embodiment of the present invention.

Example of a Memory Implementing the Method According to Another Embodiment of the Present Invention FIG. 4 represents a serial Flash memory MEM2 comprising an erase verify device according to another embodiment of the present invention. The memory MEM2 comprises the elements of the memory MEM1 already described, designated by the same references. Thus the data interleaving Flash memory array MA, the word line decoder WLDEC, the column decoder COLDEC comprising n decode blocks CDk (CD0, CD1, . . . CDn−1) associated with the electric columns COLk of the memory array, the input BUF1 and output BUF2 buffers, the data bus DTB, the sequencer SEQ . . . are all present again.

The output of each decode block CDk is linked, as above, to a read circuit RCTk (RCT0, RCT1, . . . RCTn−1) and to a verify-program circuit VPCTBk (VPCTB0, VPCTB1, . . . VPCTBn−1). Each read circuit RCTk comprises, as above, a sense amplifier SA having a read input linked to an output of the corresponding decode block, and an output linked to the data bus DTB as well as to the corresponding verify-program circuit VPCTBk. Each verify-program circuit VPCTBk comprises, like the circuits VPCTAk described above, a data latch DLT, a logic control circuit CONTCT and a programming latch PLT, these elements being of the same structure as those described above. Thus the latch DLT is linked at input to the data bus DTB and receives a bit Bpk to be saved in a memory cell. The control circuit CONTCT is linked to the output of the latch DLT, for receiving the bit Bpk, and is also linked to the output of the sense amplifier SA of the circuit RCTk, for receiving a bit Brk read by the sense amplifier during a verify-program cycle. The control circuit CONTCT supplies a signal DTOKk to the programming latch PLT. The programming latch PLT has an output linked to the output of the corresponding decode block CDk, a control input receiving the signal DTOKk, a trigger input receiving the verify signal VRFY common to all the programming latches, and an input receiving the pulses of programming voltage VPP supplied by the generator VPGEN.

The saving of a word in the memory array comprises, as above, the application of a word line address ADH to the decoder WLDEC, the erasure of the selected page, the application to the decoder COLDEC of a logic column address ADL, the loading of the bits Bp0, Bp1, Bp2, . . . Bpk, Bpn−1 of the word to be saved into the latches DLT, then the execution of verify-program cycles. On the rising edge of the pulse VRFY, each sense amplifier reads a bit Brk (Br0, Br1, Br2 . . . Brn−1) in a memory cell. On each falling edge of the pulse VRFY, the programming latch PLT becomes transparent if the signal DTOKk is on 1 or goes off if the signal DTOKk is on 0. If the latch is transparent, it sends the pulse of programming voltage VPP to the corresponding bit line. Again as above, the signal DTOK is set to 1 by the circuit CONTCT if the bit to be saved Bpk is equal to 1, or if the bit to be saved Bpk is equal to 0 and the bit read Brk is equal to 0.

Each verify-program circuit VPCTBk further comprises an erase verify circuit EVCT that receives at input the bit Brk read by the sense amplifier SA as well as the bit to be saved Bpk supplied by the data latch DLT. The erase verify circuit ECVT supplies a signal BVOKk by executing here the following logic function:

$$BVOKk = Bpk + Brk$$

i.e. an OR function between the bit read and the bit to be saved.

In order to control the verify operation in its entirety, the signals BVOKk (BVOK0, BVOK1, BVOK2 . . . BVOKn−1) are collected by a logic gate G3 of NAND type. The output of the gate G3 supplies a collective signal /BVOK that only goes to 0 when all the individual signals BVOKk are on 1. The signal /BVOK is, moreover, applied to the input S ("Set") of a synchronous latch DL1 of RS type, the input R ("Reset") of which is controlled by a reset signal RSTD supplied by the sequencer. The latch DL1 has an inverting output /Q that is linked to the state register SREG and supplies a signal BVOKs saved as a flag in the state register. The latch DL1 has a synchronisation input H, active on falling edge, receiving a signal VRFY0. The signal VRFY0 is supplied by the sequencer SEQ during the programming operation. More particularly, the signal VRFY0 has one and only one pulse, which is a copy of the first pulse of the verify signal VRFY sent during an operation of programming a word.

The collective signal /BVOK has a significant value after the rising edge of the pulse VRFY has triggered the reading of the data in a row of memory cells selected for the programming. Each individual signal BVOKk is here on 1 if:
A) the bit Brk read in the selected memory cell is equal to 1 and the bit Bpk to be saved in the memory cell is equal to 0,
B) the bit Bpk to be saved in the memory cell is equal to 1.

The case A corresponds to the classical erase verify test, when all the words to be saved are equal to 0. The case B allows the erase verification to be inhibited on certain words and complex test sequences to be created, as will be described below.

The latch DL1 is reset to 0 before a programming operation, such that the signal BVOKs is forced to 1. The latch DL1 is then activated on the first falling edge of the signal VRFY0, which corresponds to the first falling edge of the first pulse of the signal VRFY, i.e. before the application of the first pulse of programming voltage. If at that instant the signal /BVOK is equal to 0, which means that all the individual signals BVOKk are on 1, then the signal BVOKs remains on 1.

In one preferred embodiment, the latch DL1 is not reset to 0 between two operations of programming memory cells, when several rows of memory cells are programmed in bursts. In this case, the signal BVOKs indicates the general result of the verifications performed at each operation of programming a row of memory cells. If the signal /BVOK is on 0 during the reading occurring on the first rising edge of the signal VRFY, the signal BVOKs remains on 1 upon the falling edge of the signal VRFY0, when the input H of the latch DL1 is activated. If however, during an operation of programming a row of memory cells, one of the memory cells of the row does not have the erase value, then the input S of the latch DL1 is activated and the signal BVOKs goes to 0 at the output /Q. If, subsequently, the signal /BVOK is on 0 upon programming the other rows of memory cells, the signal BVOKs nonetheless remains on 0 since the latch can only be reset to 0 by means of the external signal RSTD, which is only delivered once by the sequencer, before triggering the cycles of programming in bursts. Therefore, a failure in one of the tests of verifying the erase value of a row of memory cells is sufficient for the flag BVOKs to go to 0 and keep that value.

Figure 5:
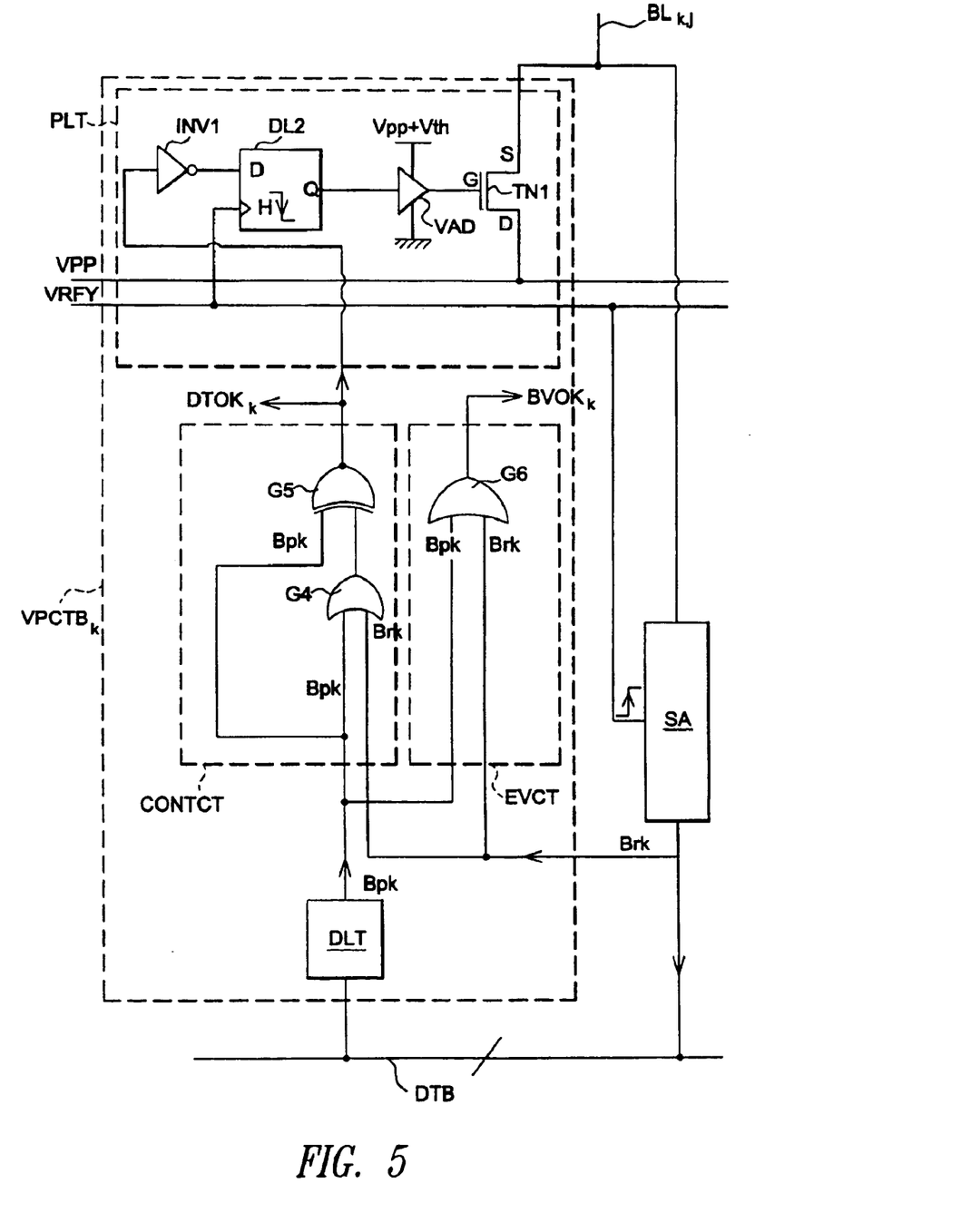
FIG. 5 is the logic diagram of certain elements of the verify-program device and of the erase verify device represented in FIG. 4, and FIGS. 6A to 6G are timing diagrams of logic signals intervening in a programming operation comprising an erase verify step according to one embodiment of the present invention.

FIG. 5 represents an example of an embodiment of a verify-program circuit VPCTBk, comprising a data latch DTLT, a control circuit CONTCT, an erase verify circuit EVCT according to one embodiment of the present invention, and a programming latch PLT.

The programming latch PLT comprises an inverting gate INV1, a synchronous D latch DL2, a voltage adapter VAD and an NMOS transistor TN1. The inverting gate receives the signal DTOKk supplied by the control circuit CONTCT and applies this inverted signal to the input D of the latch DL2, the output Q of which is applied to the input of the voltage adapter VAD. The latter is powered by a voltage VPP+VTH, VTH being the threshold voltage of the transistor TN1, and its output drives the gate of the transistor TN1. The output of the adapter VAD transforms a logic signal equal to 1 supplied by the output Q of the latch, into a voltage signal VPP+VTH, while a logic signal on 0 is copied in a zero voltage signal. The trigger input H of the latch, active on falling edge, receives the pulses of the signal VRFY. The drain of the transistor TN1 receives the pulses of programming voltage VPP. The source of the transistor TN1 is linked to a bit line BLk,j via the column decoder (not represented in FIG. 5).

Upon each pulse of the signal VRFY, the output Q of the latch DL2 is refreshed and copies the value present at the input D. If the signal DTOK is on 0 upon receiving a falling edge of the signal VRFY, the output Q goes to 1 and the adapter supplies the voltage VPP+VTH to the gate of the transistor TN1, which becomes or remains on. Thus, when the pulse VPP is sent, the latter is sent by the transistor TN1 to the bit line and a selected memory cell receives a pulse of programming voltage VPP.

The control circuit CONTCT comprises a logic gate G4 of OR type receiving at its inputs the bit to be saved Bpk and the bit Brk (read by the amplifier SA on the rising edge of the signal VRFY). The output of the gate G4 is applied to an input of a gate G5 of EXCLUSIVE-NOR type (NXOR) receiving at a second input the bit to be saved Bpk. The output of the gate G5 supplies the signal DTOKk, which is equal to $$DTOKk = Bpk + /Bpk*/Brk + Bpk*Brk$$

This logic equation is strictly identical to the one described above, i.e.:

$$DTOKk = Bpk + /Bpk*/Brk$$

as the term Bpk*Brk has no effect on the value of the equation.

The erase verify circuit EVCT comprises a gate G6 of OR type, receiving at input the bits Bpk and Brk and supplying the signal BVOKk, in accordance with the logic equation described above (BVOKk=Bpk+Brk).

FIGS. 6A to 6G are timing diagrams showing a programming operation according to the present invention, comprising the classical verify algorithm and also incorporating the erase verify algorithm according to the present invention. The programming operation is here applied to a memory cell that is assumed to have first been erased.

Figure 6A:
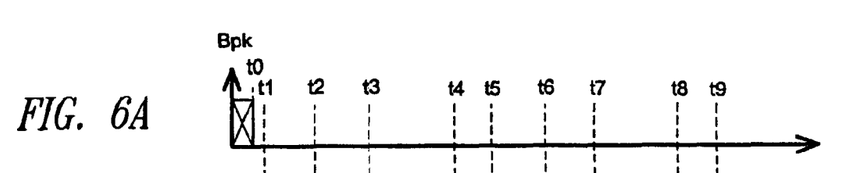
Figure 6B:
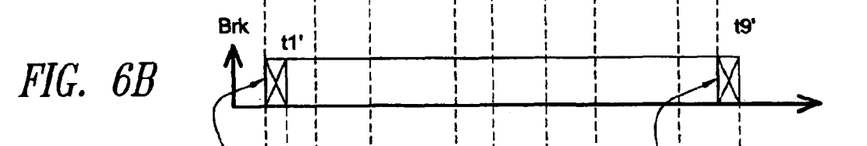
Figure 6C:
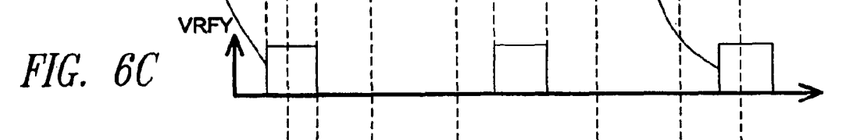
Figure 6D:
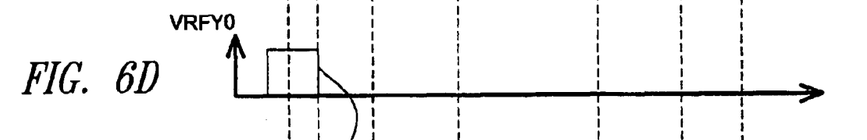
Figure 6E:
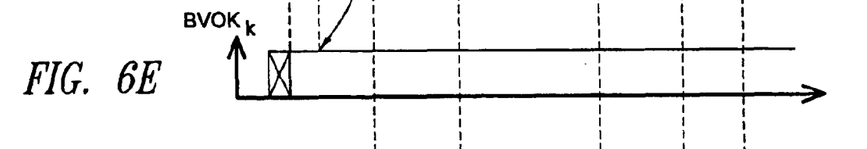
Figure 6F:
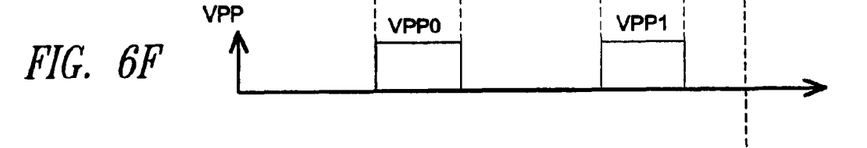
Figure 6G:
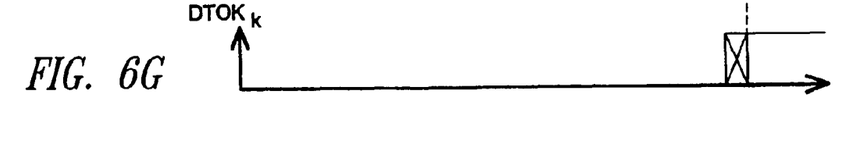

FIG. 6A represents the bit Bpk loaded in the latch DLT, intended to be saved in the memory cell. FIG. 6B represents the bit Brk read in the memory cell during the programming operation. FIG. 6C represents the pulses of the signal VRFY. FIG. 6D represents the pulse of the signal VRFY0. FIG. 6E represents the signal BVOKk. FIG. 6F represents the pulses of the programming voltage VPP and FIG. 6G represents the signal DTOKk.

At an instant T0, a bit Bpk, here equal to 0, is loaded into the register DLT. At an instant t1, a rising edge of the first pulse of the signal VRFY appears, as well as a rising edge of the signal VRFY0, which copies the first pulse of the signal VRFY. The memory cell is read by a sense amplifier that delivers a bit Brk equal to 1 (memory cell erased) at an instant t1', the difference between t1' and t1 corresponding to the time for reading and stabilising the sense amplifier. At the instant t1', the signal BVOKk also goes to 1 since the datum read is equal to 1, which confirms that the memory cell read is in the erased state. At an instant t2, a falling edge of the signal VRFY0, corresponding to a falling edge of the first pulse of the signal VRFY, validates the signal BVOKs (latching of the collective signal /BVOK by the latch DL1, FIG. 4). Between instants t3 and t4, a pulse VPP0 of the programming voltage VPP is applied to the memory cell, the signal DTOKk being on 0. Between instants t5 and t6, another pulse of the signal VRFY is sent. The datum read Brk does not change value which means that the cell is still in the erased state. The signal DTOKk therefore remains equal to 0. Between instants t7 and t8, a second pulse VPP1 of the programming voltage VPP is applied to the memory cell. At an instant t9, another pulse VRFY is sent (rising edge). At an instant t9', after stabilisation of the sense amplifier, the bit Brk read in the memory cell goes to 0 which means that the memory cell is now programmed, after two pulses of voltage VPP. Thus, at the instant t9', the signal DTOKk goes to 1, indicating that the cell is programmed. The programming latch PLT goes off (FIG. 5) and prevents other pulses of programming voltage from being applied to the memory cell.

In the foregoing, it was indicated that the individual erase verify signals BVOKk are also on 1 when the bit Bpk to be saved in the memory cell is equal to 1 (case B), due to the fact that the signals BVOKk are produced by combining the bits Brk and Bpk, this combination being done here by means of the OR function. This characteristic of the erase verify device according to the present invention allows the erase verification to be inhibited on certain binary words and complex test sequences to be created. It will be assumed, as an example, that a page, after being erased, alternately receives words on 0 and words on 1, such as the following sequence for example in which the words are bytes:
000000001111111100000000111111110000000011111111

In this case, the erase verify algorithm is inhibited for the memory cells that must receive bits on 1, since these bits force the individual signals BVOKk to be equal to 1.

It will be understood by those skilled in the art that various other alternatives of the present invention may be made, particularly regarding the logic function allowing the erase verify signals to be produced, the means for latching the erase verify signals, the sequencing of the verify-program cycles, etc. The present invention is further applicable to various types of memories in which a programming operation comprises verify-program cycles. Thus, although the present invention has been initially designed to facilitate the erase verify test in serial memories, nothing prevents the present invention from also being implemented in parallel input/output memories.

Furthermore, those skilled in the art can provide various peripheral means for activating and deactivating the algorithm according to the present invention, such as a mode flag for example saved in the state register SREG that is set to 1 for activating the erase verify algorithm or set to 0 for deactivating it.

The implementation of the present invention is particularly advantageous in a serial Flash memory comprising means for simulating programming by page. This memory comprises an internal buffer memory of SRAM type for receiving and storing in a single instruction all the binary words of a page. The sequencer then programs the page word by word, in a transparent manner to the user, by reading the buffer memory word by word and by saving the words in the memory array. During the saving of a page, the verify algorithm according to the present invention can be activated, by putting the memory into test mode. After the whole page has been saved, the user can consult the flag BVOKs in the state register to find out whether or not at least one erase verify test has resulted in failure.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. An electrically erasable and programmable memory, comprising:
   memory cells;
   a verify-program device arranged for saving a datum in one of the memory cells by repeating a verify-program cycle until the datum is saved in the memory cell, without exceeding N cycles, the verify-program cycle including reading the memory cell then applying a pulse of a programming voltage to the memory cell if the datum to be saved has a program logic value and if the datum read in the memory cell has an erase logic value;
   an erase verify device arranged for:
      supplying an erase verify signal having a determined value when the datum read in a memory cell during the first verify-program cycle of an operation of programming the memory cell, has an erase logic value; and
      latching the erase verify signal before applying the first pulse of programming voltage to the memory cell.

2. The memory according to claim 1 wherein the erase verify device is arranged for supplying an erase verify signal having said determined value when a datum to be saved itself has an erase logic value.

3. The memory according to claim 1, comprising a determined number of sense amplifiers for simultaneously reading a corresponding number of selected memory cells during an operation of saving data in the selected memory cells, and wherein the erase verify device comprises a corresponding number of erase verify circuits, each erase verify circuit being linked to a respective one of the sense amplifiers and supplying an individual signal for erase verifying a memory cell having said determined value when the datum read in the memory cell during the first verify-program cycle of the memory cell has the erase logic value.

4. The memory according to claim 3 wherein an erase verify circuit comprises a logic gate receiving at one input the datum read during the first verify-program cycle of the memory cell, and supplying the individual erase verify signal.

5. The memory according to claim 4 wherein the logic gate is arranged for combining the datum read in the memory cell during the first verify-program cycle of the memory cell and the datum to be saved in the memory cell, the individual erase verify signal varying according to the result of the combination.

6. The memory according to claim 5 wherein the logic gate is of OR or NOR type.

7. The memory according to claim 3 wherein the erase verify device comprises a logic circuit for collecting all the individual erase verify signals supplied by the erase verify circuits, and for supplying a collective signal for erase verifying a plurality of memory cells.

8. The memory according to claim 7, comprising means for latching the value of the collective verify signal before applying the first pulse of programming voltage.

9. The memory according to claim 8, comprising means for supplying a series of pulses of verify signals applied to the verify-program device, and for supplying an erase verify latching signal after sending the first pulse of the verify signal.

10. A method for testing an electrically erasable and programmable memory that includes memory cells and a verify-program device, the method comprising
   saving a datum in one of the memory cells by repeating a verify-program cycle until the datum is saved, without exceeding N cycles, the verify-program cycle comprising reading the memory cell that must receive the datum, then applying a pulse of a programming voltage to the memory cell if the datum to be saved in the memory cell has a program logic value and if the data read in the memory cell has an erase logic value;

supplying an erase verify signal having a determined value when the datum read in the memory cell during a first one of the verify-program cycles, has an erase logic value; and latching the erase verify signal before applying the first pulse of programming voltage to the memory cell.

11. The method according to claim 10, further comprising supplying the erase verify signal having said determined value when the datum to be saved itself has the erase logic value.

12. The method according to claim 10, wherein the memory includes a determined number of sense amplifiers allowing a corresponding number of selected memory cells to be simultaneously read during an operation of saving data in the selected memory cells, the method comprising producing a number of individual erase verify signals during the saving of data corresponding to the corresponding number of selected memory cells.

13. The method according to claim 12, comprising combining the individual erase verify signals to supply a collective signal for erase verifying of the selected memory cells.

14. The method according to claim 13, comprising latching the collective erase verify signal before applying the pulse of programming voltage during the first verify-program cycle.

15. An electrically erasable and programmable memory, comprising:

memory cells arranged in rows and a number of columns;

a first read circuit having an output and an input connected to a first one of the columns of memory cells and structured to read a datum stored in a selected one of the memory cells in the first column;

a first verify-program device having a first input connected to receive an input datum, a second input connected to the output of the first read circuit, and an output that supplies a program signal to program the datum into the selected memory cell;

a first erase verify device having a first input connected to receive the input datum, a second input connected to the output of the first read circuit, and an output that supplies an erase verify signal having a value that reflects whether the input datum is equal to the datum read by the first read circuit.

16. The memory according to claim 15 wherein the first erase verify device includes a logic gate of OR or NOR type having first and second inputs connected to the input datum and the output of the first read circuit, respectively.

17. The memory according to claim 15 wherein:

the first read circuit is one of a plurality of read circuits connected respectively to the columns, each read circuit being structured to read a datum stored in a selected one of the memory cells in the column to which the read circuit is connected;

the first verify-program device is one of a plurality of verify-program devices having outputs connected respectively to the columns, each verify-program device having a first input connected to an output of a corresponding one of the read circuits and a second input connected to receive a corresponding one of a plurality of input data; and the first erase verify device is one of a plurality of erase verify devices, each erase verify device having a first input connected to the output of the corresponding read circuit, a second input connected to receive the corresponding input data, and an output that supplies an individual erase verify signal having a value that reflects whether the corresponding input datum is equal to the datum read by the corresponding read circuit.

18. The memory according to claim 17, further comprising a logic circuit connected to receive the individual erase verify signals supplied by the erase verify circuits, and structured to supply a collective signal for erase verifying a plurality of memory cells.

19. The memory according to claim 18, further comprising a latch having an input connected to receive the collective verify signal.

20. The memory according to claim 19, further comprising a sequencer having a plurality of outputs connected to the read circuits, verify-program devices, and the latch, and being structured to cause the latch to latch the collective signal before the verify-program devices supply programming voltages to the memory cells in order to program the input data.

* * * * *